United States Patent [19]

Germer et al.

[11] Patent Number: 5,068,962
[45] Date of Patent: Dec. 3, 1991

[54] METHOD OF FABRICATING AN ENERGY METER

[75] Inventors: Warren R. Germer, Dover; Peter F. Coryea, Salem; Jacob M. Stillwagon, Nottingham, all of N.H.

[73] Assignee: General Electric Company, Somersworth, N.H.

[21] Appl. No.: 618,846

[22] Filed: Nov. 28, 1990

Related U.S. Application Data

[62] Division of Ser. No. 412,351, Sep. 25, 1989, 4,994,734.

[51] Int. Cl.⁵ .............................................. H05K 3/36
[52] U.S. Cl. ..................................... 29/830; 329/114; 329/142; 329/156; 361/370; 361/405; 439/167
[58] Field of Search ............... 361/405, 370; 29/840, 29/846; 439/166, 167; 324/132, 114, 156

[56] References Cited

U.S. PATENT DOCUMENTS 2,691,769 10/1954 Knopp ............................... 439/167
4,892,485 1/1990 Patton ............................... 29/846 X Primary Examiner—Carl J. Arbes
Attorney, Agent, or Firm—Robert E. Brunson; Irving M. Freedman

[57] ABSTRACT

An output connection and signal conditioning circuit board is selected and detachably connected to an electronic energy meter to customize its functions. Connectors are provided at the ends of the circuit board to mate with an edge connector in the bezel of the register and spaced holes in the base. A separate flexible connection to the KYZ terminals is provided, along with an intermediate tab and slot to position the circuit board and strengthen the meter. A selected circuit board is added to the manufactured meter to meet customer requirements by inserting a pin connector at the bottom of the circuit board through the spaced holes, and rotating the circuit board to mate with the tab and the edge connector.

10 Claims, 2 Drawing Sheets

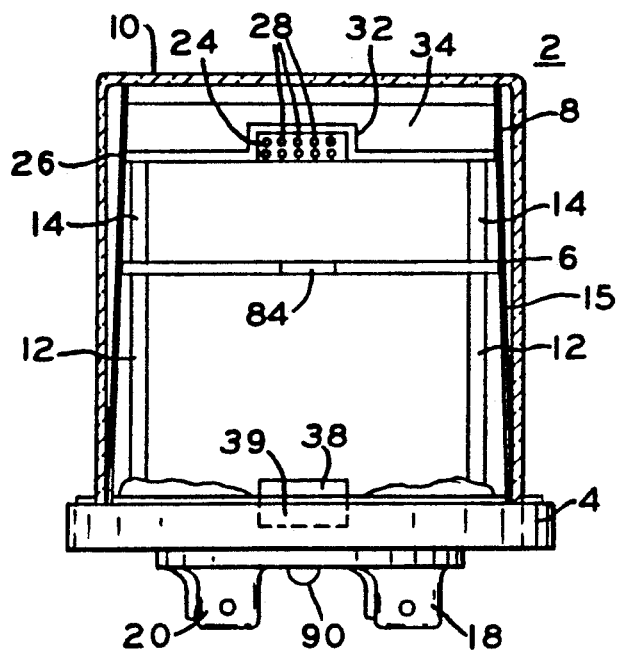
FIG_1
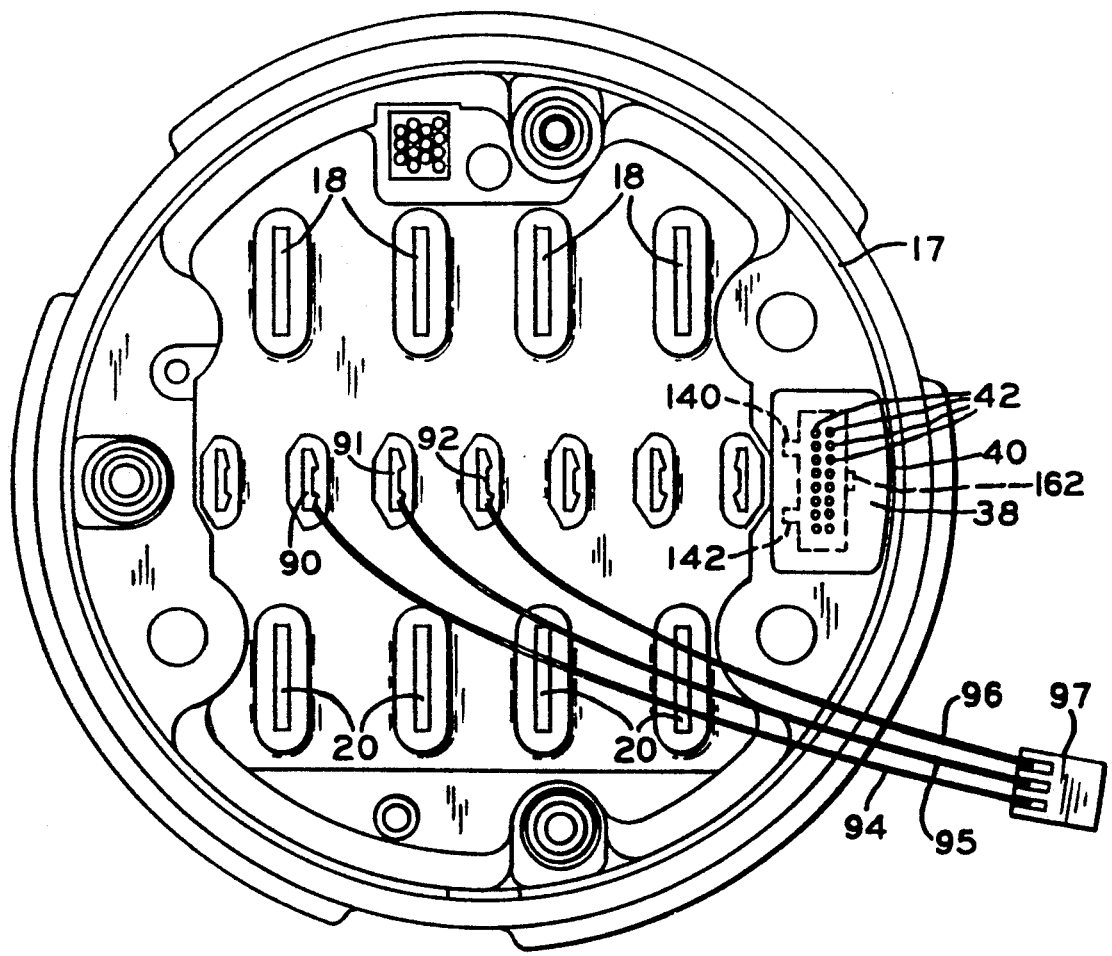
FIG_2

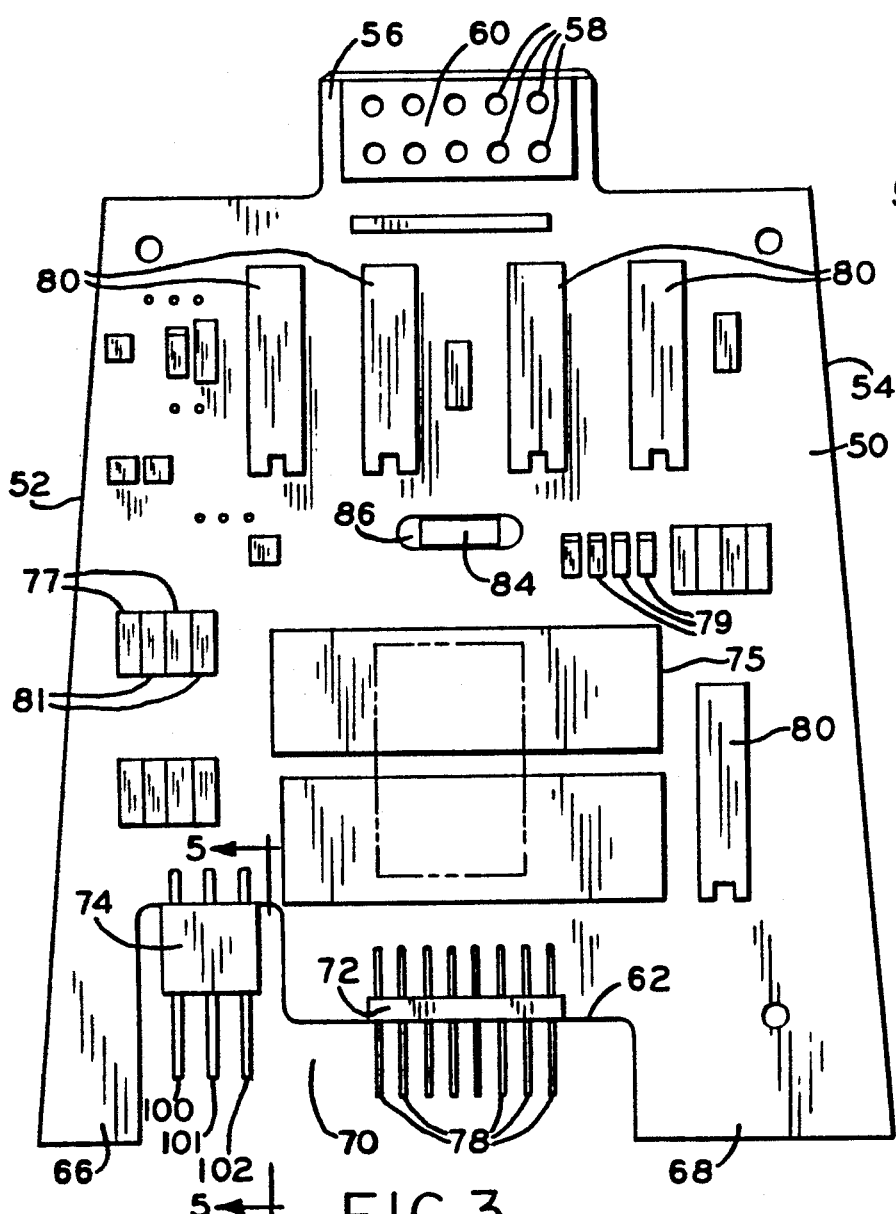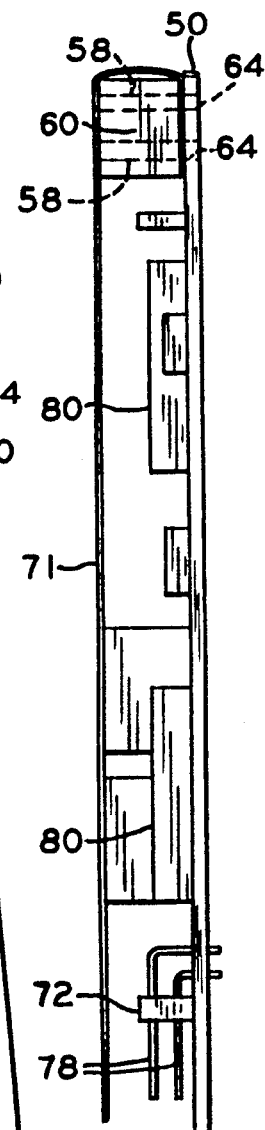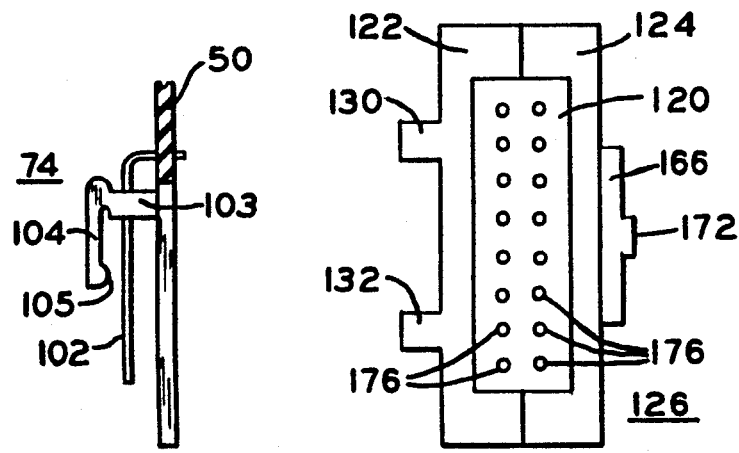

METHOD OF FABRICATING AN ENERGY METER

This is a divisional of copending application(s) Ser. No. 07/412,351 filed on Sep. 25, 1989, now U.S. Pat. No. 4,894,734 issued Feb. 19, 1991.

BACKGROUND OF THE INVENTION

Present day electronic energy meters and registers have greatly expanded capabilities and are being called upon to provide additional functions beyond simple indications of kilowatt hour consumption and kilowatt demand. Examples of such additional functions are pulse initiators, time of use rate period indications, end of demand interval indicator, load control signals, a demand threshold indicator, and an external control signal to inhibit accumulation of pulses in various register modes. In addition, the relative complexity of such electronic meters, which include microprocessors and data processing circuitry, requires the use of sophisticated electronic test equipment in the repair of such meters. It has become necessary to provide external signals to an electronic energy meter, and to bring electronic signals out of the electronic energy meter. However, many of the connections, configurations, and dimensions of an energy meter are defined by industry standards, namely the American National Standards Institute (ANSI) standards. For example, some transformer rated versions of the ANSI standard S-base meter have provisions for the pulse initiator KYZ output connections to be made through spare terminals in the meter. Various approaches have been suggested or utilized to provide additional means for bringing signals into or out of electronic energy meters. One method has been to provide a short multi-conductor cable protruding through a hole in the base of the meter and terminating in a connector which then can be connected to external equipment. However, not every energy meter requires external signals such that it is desirable to have a standard energy meter which is flexible in enabling external signals to be provided by the manufacturer at the time of manufacture, or to be added later by the end user or by the manufacturer. That is, it is highly desirable to have the flexibility built into a standard energy meter for later customizing as required, including the ability to provide or connect to external signals.

In addition, electronic energy meters are constructed in a layered configuration with the socket or base forming the bottom layer, and the register or meter which provides the readings at the top layer. Also, there may be one or more intermediate layers of electronics, such as electronic circuit boards, provided. It is important that the construction of such layered meters be provided with proper structural support and integrity. While external signals may be connected to a plurality of layers in the energy meter, it is highly desirable that the external connector be provided through the base of the meter.

In addition, the control signals in an electronic energy meter are often not suitable for direct use outside the meter, and electronic signal conditioning is generally required. In those meters where external signals are required, it is desirable that the signal conditioning circuitry be added to the interior of the energy meter. It is also desirable to provide for the additional signal conditioning circuitry to be selectively added by the manufacturer during or after manufacture, or by the end user after delivery, and even use of, the energy meter. The cost of manufacturing electronic energy meters and the delivery cycle can be reduced if a standard, but flexible meter can be manufactured and stocked with the various customer requirements and features later, and selectively added; that is, providing the ability to accommodate the late point identification of features.

OBJECTS AND SUMMARY OF INVENTION

It is an object of the present invention to provide the flexible capability to an electronic energy meter to selectively add external signal connections.

It is another object of the present invention to provide for flexible addition of external signal connections in an electronic energy meter including provisions for the addition of signal processing within the meter.

It is still another object of the present invention to provide the capability to flexibly add external signal connections to an electronic energy meter, while maintaining and enhancing the structural integrity and strength of the meter.

It is yet another object of the present invention to provide a signal conditioning circuit board in an electronic energy meter which enhances the structural integrity of the meter.

It is a further object of the present invention to reduce cost and the length of the delivery cycle between identification of the features required by a customer and completion of the meter.

In accordance with one embodiment of the present invention, a signal conditioning and connection assembly is provided to customize an electronic energy meter by connecting the register assembly of the meter through its base for connection to external circuitry. The base of the meter includes a plurality of spaced holes and the register circuit board includes an edge connector in an aperture in the meter bezel. A register circuit board is selectively connected to provide signal conditioning between the register and the outside of the meter through connectors on the register circuit boards mating with the register edge connector on the upper end, and pins passing through the spaced holes on the bottom. A tab intermediate to the base and register cooperates with an aperture in the register circuit board to facilitate positioning and retention of the circuit board. The register circuit board is selectively connected by inserting the pins into the spaced holes, and rotating the board until the tab passes through the aperture, and the upper connector mates with the edge connector. Another connector on the circuit board enables selective connection through the KYZ terminals in the meter base.

BRIEF DESCRIPTION OF DRAWINGS

FIG. 1 is a drawing of an electronic energy meter incorporating the present invention.

FIG. 2 shows the interior of the base of the energy meter of FIG. 1.

FIG. 3 shows a register circuit board used in the electronic energy meter of FIG. 1.

FIG. 4 is a side view of the register circuit board of FIG. 2.

FIG. 5 is a side view of a section of FIG. 1 taken along the line 5—5 in FIG. 3.

FIG. 6 is an enlarged view showing the connector provided for external connections in the base of the energy meter of FIG. 1.

Referring to FIG. 1, an electronic energy meter 2 is shown schematically as including a base module 4, an electronic or voltage module 6, and a register or indicator module 8. A plurality of supports 12 supports the voltage module 6 in spaced relation to, and upon, the base module 4; while a plurality of supports 14 support the register module 8 in spaced relation to, and upon, the voltage module 6. The base module 4 includes a plurality of circuit terminals such as 18 and 20 which project through the base of module 4 to the interior of the meter. The size, location and usage of the plurality of the circuit terminals such as 18 and 20 are dictated by the American National Standards Institute (ANSI) standards such as ANSI standard C12.10-1978. Details of the construction of an electronic energy meter which incorporates the present invention are set forth in co-pending U.S. Pat. No. 5,001,420 Modular Construction For Electronic Energy Meter assigned to the same assignee as the present invention, and hereby incorporated by reference. In accordance with one embodiment of the present invention, the internal control signals of the register 8 are all brought to an edge connector 24 at one side of the register circuit board 26 of the register 8. The male terminals such as 28 extend radially outward from, and parallel to, the register circuit board 26. The edge connector 24 is positioned within an aperture 32 formed within the bezel 34 of the register 8. The edge connector 24 includes in one embodiment two parallel rows of 9 connectors each, for a total of 18, although all of the connectors are not shown in FIG. 1.

The base module 4 includes a base connector housing 38 with a plurality of small holes, 16 in number, arranged in a double row of 8 each, corresponding in size and spacing to the pins of a double row header described below. The base connector housing 38 is molded as part of the base module 4, and the small holes extend vertically through the housing. Thus, the holes in the base connector 38 extend in the direction of the axis of the electronic energy meter 2, while the terminals 28 extend perpendicular to the axis of the meter.

Referring to FIG. 2, it is to be noted that the base connector housing 38, molded as part of the base module 4, extends from the rim 40, above which the transparent housing 10 is positioned, and includes a plurality of holes 42 which pass through the top of the base connector housing to the interior of the generally rectangular cavity or re-entrant pocket 39 (shown in FIG. 1) formed underneath the base by the base connector housing 38.

The general configuration of the register circuit board is shown in FIGS. 3, 4 and 5. Referring to FIGS. 3, 4 and 5, the register circuit board 50 is configured in the general shape of a truncated triangle having inwardly tapering sides 52 and 54, and upwardly extending tab 56 which supports the register connector 60 bearing female contacts 58 which are sized to mate through openings 64 in the circuit board with the edge connector 24 of the register module 8. The bottom edge 62 of the register circuit board 50 has two separated legs 66 and 68 with a cavity 70 therebetween in which are positioned the 16 pin right angle pin header 72 and an additional 3 pin right angle pin connector 74. The legs 66 and 68 protect the pins from damage when the register circuit board 50 is being handled or worked on. It is to be noted that the right angle header 72 is positioned below tab 56 located at the opposite end of register circuit board 50 such that the pins 78 of the right angle pin headers 72 are positioned beneath the female connectors 58. The pins 28 which extend through the register connector 60 are in line with, but above, the two rows of holes 42 in base connector housing 38.

The various electronic components on the register circuit board 50, such as resistors 77, diodes 79 and integrated circuits 80, are provided in accordance with the output functions required. It is a purpose of the present invention to have the dimensions, mounting and interconnection of the various register circuit boards 50 for the electronic energy meter 2 of a standard configuration such that the electronic circuitry associated with the register circuit boards may be customized to meet the requirements and demands of a particular customer or application, while the basic energy meter remains a relatively standard configuration. That is, a family of some 6 or 8 register circuit boards can comply with substantially all customer needs, requirements, and options, and these may be inserted into the standard energy meter during the final phases of manufacture, or even added or changed subsequent to delivery of the meter to the customer. This concept of "late point identification" of features facilitates the mass production of energy meters and the stocking of quantities of substantially complete, or completed, electronic energy meters which may be subsequently customized through the addition of a selected output printed wiring board from a group of boards which may be separately stocked in quantity. The mounting and connecting of the selected register circuit board 50 is readily accomplished by holding the register circuit board at an angle with the upwardly extending tab 56 slightly away from the edge connector 24 until the pins 78 are positioned through the holes 42 in the base connector housing 38. The top of the register circuit board 50 may then be rotated inwardly, about the pins 78 in the holes 42 as an axis, toward the edge connector 24. The extension tab 84 on the intermediate electronic module 6 (best shown in FIG. 1) protrudes through the opening or slot 86 in register circuit board 50 to hold and position the register circuit board. Further rotation of the register circuit board 50 forces the female connectors 58 of register connector 60 into contact with the male terminals 28 of the edge connector 24 completing the connections between the register module 8 and the exterior of the electronic energy meter 2 below the base module 4 in the cavity or receptacle 39 (best shown in FIG. 1). The extension tab 84 within the slot 86 also resists the thrust of the external connector or plug 120 (see FIG. 6) being pressed into contact with the pins 78. This relieves the thrust which would otherwise be transmitted through the register circuit board to the edge connector 24.

Once inserted and connected, the register circuit board 50 provides a support panel between base module 4, voltage module 6, and the register 8 aiding in the total integration and support of the meter assembly.

It is highly desirable that an energy meter be readily configurable through any of the possible meter forms, including the transformer rated category, in order to meet the various industry standard configurations while using the industry standard base prescribed by the American National Standards Institute (ANSI) standards. In accordance with ANSI standards, the various circuit terminals such as 18 and 20 in FIG. 2 are proscribed as to size and location, along with intermediate row of terminal connectors including terminals 90, 91 and 92, the general location of which is shown as terminal 90 in FIG. 1. The ANSI standard S-base meter allows the pulse initiator KYZ output connections to be made through these spare meter/circuit terminals.

These spare terminals have proven to be adequate for the more conventional electromagnetic watthour meter, but have proven inadequate for the signal processing capability and requirements of an electronic energy meter.

However, it is desirable to provide an electronic watthour or energy meter with the capability to be completely interchangeable with existing and installed energy meters. That is, form, fit and function of the meters should be interchangeable, even though the electronic energy meter has greatly expanded capabilities and functions such as built-in test and other functions described above. Accordingly, the KYZ output connections 90, 91 and 92 are connected through leads 94, 95 and 96, respectively, to connector 97 which includes female terminals adapted to mate with the rectangular pin connector 74 on the register circuit board 50.

The KYZ conductors of connector 74 are best shown in FIGS. 3 and 5, in which FIG. 5 is a cross-sectional view taken along the line 5—5 of FIG. 3. Referring to FIGS. 3 and 5, the KYZ pin connector 74 includes 3 pins 100, 101 and 102, respectively, which are configured to mate with the female terminals within connector 97 for connection to the KYZ terminals 90, 91 and 92, respectively. Thus, the subject invention can incorporate a configuration compatible with existing, or even future, installations which utilize the KYZ terminals in the meter base. As best illustrated in FIG. 5, the pins 100, 101 and 102 are attached to the printed wiring board 50 in a right angle pin header configuration wherein the pins extend perpendicular to the register circuit board and then turn a substantially right angle to extend parallel to the register circuit board 50. This enables the connector 97 to be mated with the pins 100, 101 and 102 with the connector being aligned parallel with the register circuit board 50 and positioned in part between the pins 100, 101 and 102 and the face of the register circuit board. To further position and secure the pin connector 74, the header also is formed in an L-shaped configuration, with the horizontal portion 103 acting as a base and support for the pins 100, 101 and 102. The vertical portion 104 includes a rounded tip 105 turning inwardly at the free end thereof which helps position the connector 97, and also assists in retaining the connector in position once connected. The header 74 is formed of Nylon or similar material and is dimensioned to provide resiliency through rounded tip 105 which presses against the connector 97 when it is forced between the pins 100, 101 and 102 and the close fitting vertical portion 104 of the end connector 74.

The details of the reentrant pocket 39 and the connector which connects to pins 78 from underneath the base 4 are shown by FIGS. 2 and 6. Referring to FIGS. 2 and 6, the commercial 16 pin connector or plug 120 is secured between the molded members 122 and 124 of the plug assembly 126. The member 122 includes a pair of ridges or rails 130 and 132 extending upward. Mating slots 140 and 142 in the wall of the reentrant pocket 39 (see FIG. 2) receive the rails 130 and 132 to control the insertion and orientation of the plug 120. The rails 130 and 132 and slots 140 and 142 preclude attempts to insert the plug assembly 126 into pocket 39 with an improper orientation.

The member 124 includes a resilient latch plate 166 which is pivotally secured at its upper end to the member 124. Latch plate 166 is made of stainless steel and includes a projection 172 which engages a hole 162 in the wall of the reentrant pocket 38 opposite the wall including slots 140 and 142. The female connectors, such as 176, make electrical contact with the pins 78 extending through the holes 28 from the register circuit board 50. The latch plate 166 may be pivoted inwardly by pressure on the bottom of the latch plate to disengage projection 172 from hole 162, after which the plug assembly 126 may be removed from reentrant pocket 39 to disconnect the plug assembly from the register circuit board 50.

The specific electronics included on the output printed board 50 will, as pointed out above, depend on the specific functions and modes of operation desired, or required, by the customer, and by the specific installation. There are many potential options such as the provision of a signal to indicate the end of the demand interval, a demand threshold alert, pulse initiation, and various indicating and built-in test functions. However, with only 6 or 8 register circuit boards wide flexibility and versatility may be realized in meeting substantially all of the common signal requirements. Thus, the basic energy meter may be built and stocked with late point identification of specific features for a specific meter, including later selecting or changing the register circuit board to meet new or different customer requirements and features. Removal, and insertion of the same, or a different, output printing circuit board is simple and quickly accomplished. This also simplifies repair and maintenance of the boards, and of the energy meter.

The tapered sides 52 and 54 (see FIG. 3) of the register circuit board 50 allow the register circuit board to fit closely within the conical electromagnetic interference and thermal shield which surrounds it, and which is described in detail in copending U.S. patent application, Ser. No. 07/412,353 Issue Fee Paid Jan. 17, 1991, assigned to the same assignee as the present invention and hereby incorporated by reference, and is also described in the above referenced U.S. Pat. No. 5,001,420. The close fit retains the register circuit board 50 in place. The electromagnetic interference and thermal shield 15 (see FIG. 1) extends from the register 8, past and around voltage module 6 to a step 17 (see FIG. 2) in the base 4. There is a close fit between the tapered sides 52 and 54 of the register circuit board 50 and the electromagnetic interference and thermal shield 15 all along the tapered sides. The electromagnetic and thermal shield 15 thus assists in retaining the register circuit board 50 in its connected position, and is removed prior to disconnecting or removing the register circuit board.

A plastic flap 71 extends from behind and around register connector 60 and hangs down over the electronic components such as integrated circuits 80, diodes 79 and resistors 77. The flap 71 is made of mylar and is secured between the top rear of the register connector 60 and the output printed circuit board 50 to provide an insulating layer over the electronic components. A cut-out shaped around register connector 60 allows the connector to be connected to edge connector 24 with the flap 71 in place as shown in FIG. 4. The transparent flap may also include a bar code identifying the particular register circuit board 50.

The type of terminals 28 and 58 could be reversed with male terminals 58 in the register connector 60 and female terminals in the edge connector 24. Thus, while the present invention has been described through preferred embodiments, such embodiments are provided by way of example, only. Numerous variations, changes and substitutions, including those discussed above, will occur to those skilled in the art without departing from the scope of the present invention and following claims.

What we claim is:

1. A method of fabricating or retrofitting an electronic energy meter with selected signal functions for connection in circuit with a source of power and a load to be metered and utilizing industry standard base connections, and a register assembly with associated electronics adapted to be customized at the time when customer requirements and needs for the signal functions are identified, comprising the steps of:

assembling a general purpose electronic energy meter including a base assembly meeting an industry standard configuration;

positioning a register assembly including electronic circuitry above and spaced from said base assembly;

connecting a multi-pin edge connector on said register assembly to said electronic circuitry with the pins of said edge connector extending parallel to said register assembly;

providing multiple spaced apertures through said base; manufacturing a plurality of types of register circuit boards configured to provide differing desired signal functions and sized to connect between said edge connector and said multiple spaced apertures in said base below said edge connector, each of said circuit boards configured with a second connector at the top thereof to mate with said edge connector and provided with a third connector at the bottom thereof including a plurality of spaced pins adapted to pass through said spaced apertures in said base;

subsequently customizing said electronic energy meter by:

selecting an appropriate register circuit board to provide the desired signal functions;

inserting said spaced pins of said third connector through said spaced apertures in said base; and moving said second connector into contact with said edge connector; whereby selected signal processing and connections are provided between said register assembly and the exterior of said electronic energy meter through the base thereof.

2. The method of fabricating an electronic energy meter of claim 1 comprising the additional steps of providing a tab extending from said energy meter in the region between said base assembly and said register assembly, and an opening in said circuit board in the central region thereof, and moving said opening toward and around said tab while moving said second connector into contact with said edge connector.

3. The method of fabricating an electronic energy meter of claim 2 wherein a second circuit board is provided for said register assembly and positioning said multi-pin edge connector on said second circuit board.

4. The method of fabricating an electronic energy meter of claim 3 wherein said industry standard base connections include KYZ terminals, and comprising the additional steps of providing a fourth connector, and connecting said fourth connector to said KYZ terminals in the base by flexible connections.

5. The method of fabricating an electronic energy meter of claim 3 comprising the additional step of selectively providing a 3 pin connector on the bottom of certain of said register circuit boards.

6. The method of fabricating an electronic energy meter of claim 5 wherein said register circuit board is selectively removable for repair, replacement, or substitution purposes through the additional steps of:

disconnecting said second connector from said edge connector with rotation of said register circuit board about the spaced pins of said third connector in said spaced apertures through said base;

removing said opening in said circuit board from around said tab; and lifting said register circuit board to remove said spaced pins of said third connector from said spaced holes in said base.

7. The method of fabricating an electronic energy meter of claim 2 wherein said tab in said opening is positioned to resist the thrust of an external connector being pressed into contact with said pins of said third connector to prevent the transmission of said thrust through the register circuit board to said edge connector.

8. The method of fabricating an electronic energy meter of claim 1 wherein the moving of said second connector into contact with said edge connector is accomplished by rotation of said register circuit board about the pins of said third connector in said spaced apertures.

9. The method of fabricating an electronic energy meter of claim 8 wherein said register circuit board extends between said base and said register and assists in supporting and positioning said register assembly relative to said base.

10. The method of fabricating an electronic energy meter of claim 9 including the additional step of securing a fifth connector positioned outside said energy meter to said spaced pins which extend through said base to complete electrical connections from the outside of said energy meter through said base to said register assembly.

* * * * *